(12) United States Patent
Sprouse et al.

(10) Patent No.: US 8,775,722 B2
(45) Date of Patent: Jul. 8, 2014

(54) STORING DATA IN PARALLEL IN A FLASH STORAGE DEVICE USING ON CHIP PAGE SHIFTING BETWEEN PLANES

(75) Inventors: Steven Sprouse, San Jose, CA (US); Sergey Anatolievich Gorobets, Edinburgh (GB)

(73) Assignee: SanDisk Technologies Inc., Plano, TX (US)

( * ) Notice: Subject to any disclaimer, the term of this patent is extended or adjusted under 35 U.S.C. 154(b) by 153 days.

(21) Appl. No.: 13/341,543

(22) Filed: Dec. 30, 2011

(65) Prior Publication Data
US 2013/0173847 A1 Jul. 4, 2013

(51) Int. Cl.
*G06F 12/00* (2006.01)

(52) U.S. Cl.
USPC ............................ 711/103; 711/E12.008

(58) Field of Classification Search
None
See application file for complete search history.

(56) References Cited

U.S. PATENT DOCUMENTS

| | | | |
|---|---|---|---|
| 2005/0251617 A1 | 11/2005 | Sinclair et al. | |
| 2009/0089482 A1 | 4/2009 | Traister | |
| 2009/0196102 A1 | 8/2009 | Kim | |
| 2010/0142270 A1 | 6/2010 | Shibata | |
| 2010/0169553 A1 | 7/2010 | Yano et al. | |
| 2010/0309720 A1 | 12/2010 | Liu et al. | |
| 2011/0153911 A1 | 6/2011 | Sprouse et al. | |

FOREIGN PATENT DOCUMENTS

WO 2007/081638 A2 7/2007

OTHER PUBLICATIONS

Chang, Li-Pin: "Efficient Management for Large-Scale Flash Memory Storage Systems With Resource Conservation", National Chiao-Tung University, Hsin-Chu, Taiwan, Nov. 2005, 37 pages.
Lee, Yong-Goo et al.: "μ-FTL: A Memory-Efficient Flash Translation Layer Supporting Multiple Mapping Granularities", Korean Advanced Institute of Science and Technology, 2008, 10 pages.
U.S. Appl. No. 12/260,135, filed Oct. 29, 2008, "Method and Apparatus for Enforcing a Flash Memory Caching Policy", Inventors: Menahem Lasser, Izhak Afriat, Opher Lieber, 59 pages.
International Search Report issued in corresponding PCT Appln. No. PCT/US2012/070360 dated Apr. 15, 2013 (3 pgs).
Written Opinion of the International Searching Authority issued in corresponding PCT Appln. No. PCT/US2012/070360 dated Apr. 15, 2013 (6 pgs).

*Primary Examiner* — Charles Rones
*Assistant Examiner* — Tian-Pong Chang
(74) *Attorney, Agent, or Firm* — Brinks Gilson & Lione

(57) ABSTRACT

Methods and systems are disclosed herein for storing data in a memory device. Data for multiple pages is written in parallel using plane interleaving. For example, in a four plane write, a first set of four pages are written in the following sequence: 0, 1, 2, 3. A second set of four pages, after plane interleaving, are written in the following sequent: 7, 4, 5, 6. After writing the data, the pages of written data are read, page swapped if necessary, and then written into another portion of memory (such as MLC).

21 Claims, 7 Drawing Sheets

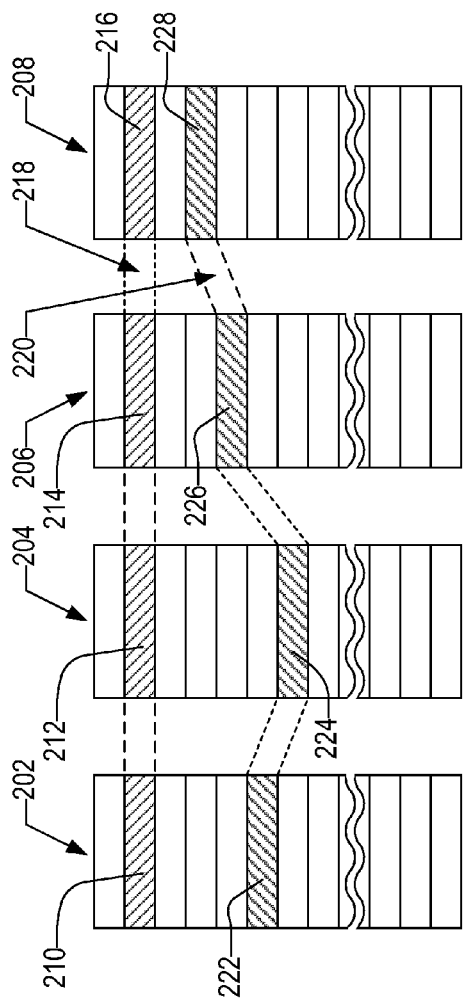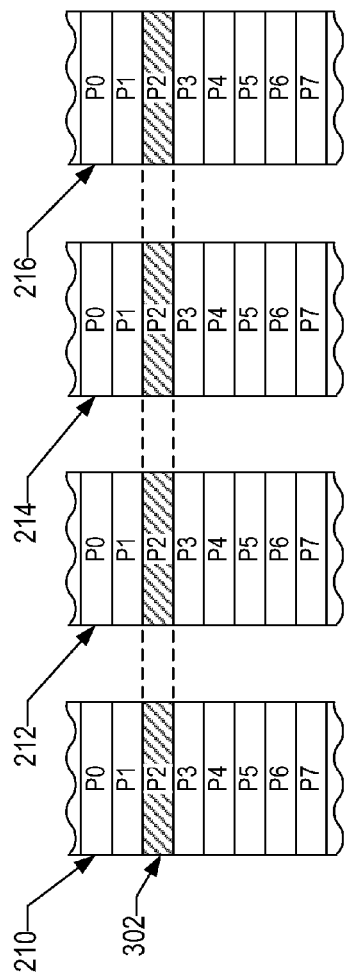

STORING DATA IN PARALLEL IN A FLASH STORAGE DEVICE USING ON CHIP PAGE SHIFTING BETWEEN PLANES

TECHNICAL FIELD

This application relates generally to memory devices. More specifically, this application relates to pre-interleaving sequential data to maximize parallel plane write performance while minimizing system metablock size.

BACKGROUND

Non-volatile memory systems, such as flash memory devices, have been widely adopted for use in consumer products. Flash memory devices may be found in different forms, for example in the form of a portable memory card that can be carried between host devices or as a solid state disk (SSD) embedded in a host device. When writing data to a conventional flash memory device, a host typically writes data to, and reads data from, addresses within a logical address space of the memory system.

The flash memory device includes an array of floating-gate memory cells and a system controller. The controller manages communication with the host system and operation of the memory cell array in order to store and retrieve user data. In order to increase the degree of parallelism during programming user data into the memory array and reading user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into the planes, or each plane may be formed from a separate one or more flash memory chips.

The memory cells of the flash memory device can be grouped together into pages and blocks. The page is the unit of data programming and reading within a block, containing the minimum amount of data that are programmed or read at one time. However, in order to increase the memory system operational parallelism, such pages within two or more blocks may be logically linked into metapages. A metapage may be formed of one physical page from multiple blocks. So that, the metapage, for example, may include the page in each of the multiple blocks but the pages of a metapage need not necessarily have the same relative position within each of the blocks. A metapage is the maximum unit of programming.

The block is composed of multiple pages with the block being the smallest grouping that is simultaneously erasable. To efficiently manage the memory, blocks may be linked together to form virtual blocks or metablocks. That is, each metablock is defined to include one block from each plane. Use of the metablock is described in U.S. Pat. No. 6,763,424, which is hereby incorporated by reference in its entirety, for all purposes. The metablock is identified by a host logical block address as a destination for programming and reading data. Similarly, all blocks of a metablock are erased together. The smallest metablock size may be a single physical block.

Metablock sizes are typically kept smaller in order to comply with various standards. However, a small metablock size reduces the number of planes that can be operated in parallel, thereby increasing the time in which to program the flash memory device. Thus, a need exists to reconcile these issues.

SUMMARY

Methods and systems are disclosed herein for storing data in a memory device.

According to a first aspect, a method for storing data in a flash storage device is provided. The method is in a flash storage device having a controller and a memory in communication with the controller, the memory including a plurality of planes, with each of the planes having a sequence of pages. The method includes: receiving data; iteratively writing portions of the data in parallel into a page in each of the plurality of planes; reading the pages in each of the planes, with at least some of the pages read in parallel being in a different respective page of the sequence of pages in the respective plane; determining, for at least one of the pages read, whether to shift pages from an initial plane to a different one of the planes; and storing the data in the memory based on the determined shift, wherein the determined shift and the storage of the data result in a sequential ordering of data within the numbered sequence of pages in at least one of the planes. One example is a memory device that includes N number of planes. The iterative writing includes: writing the first "N" pages of data in a first sequence across the "N" number of planes; and using plane interleaving to write subsequent pages of data in a sequence across the "N" number of planes that is different from the first sequence. After iteratively writing the pages of data, the data is read (either in parallel or sequentially) so that a page is read from each of the plurality of planes in a different one of the sequence of pages. After which, it is determined whether to shift the pages or perform a page swap prior to saving the pages into another section of memory. For example, the data may be read to an XDL register (or series of registers). The XDL register may then perform page swaps if necessary prior to saving the pages in multi-level cell memory.

According to a second aspect, a flash memory device configured to store data is provided. The flash memory includes: a memory that includes a plurality of planes, each of the planes having a sequence of pages; and a controller in communication with the memory. The controller is configured to: receive data; iteratively write portions of the data in parallel into a page in each of the plurality of planes; read the pages in each of the planes, at least some of the pages read in parallel being in a different respective page of the sequence of pages in the respective plane; determine, for at least one of the pages read in parallel, whether to shift pages from an initial plane to a different one of the planes; and store the data in the memory based on the determined shift, wherein the determined shift and the storage of the data result in a sequential ordering of data within the numbered sequence of pages in at least one of the planes.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

FIG. 2 illustrates an example physical memory organization of the system of FIG. 1.

FIG. 3 shows an expanded view of a portion of the physical memory of FIG. 2.

DETAILED DESCRIPTION

Figure 1:
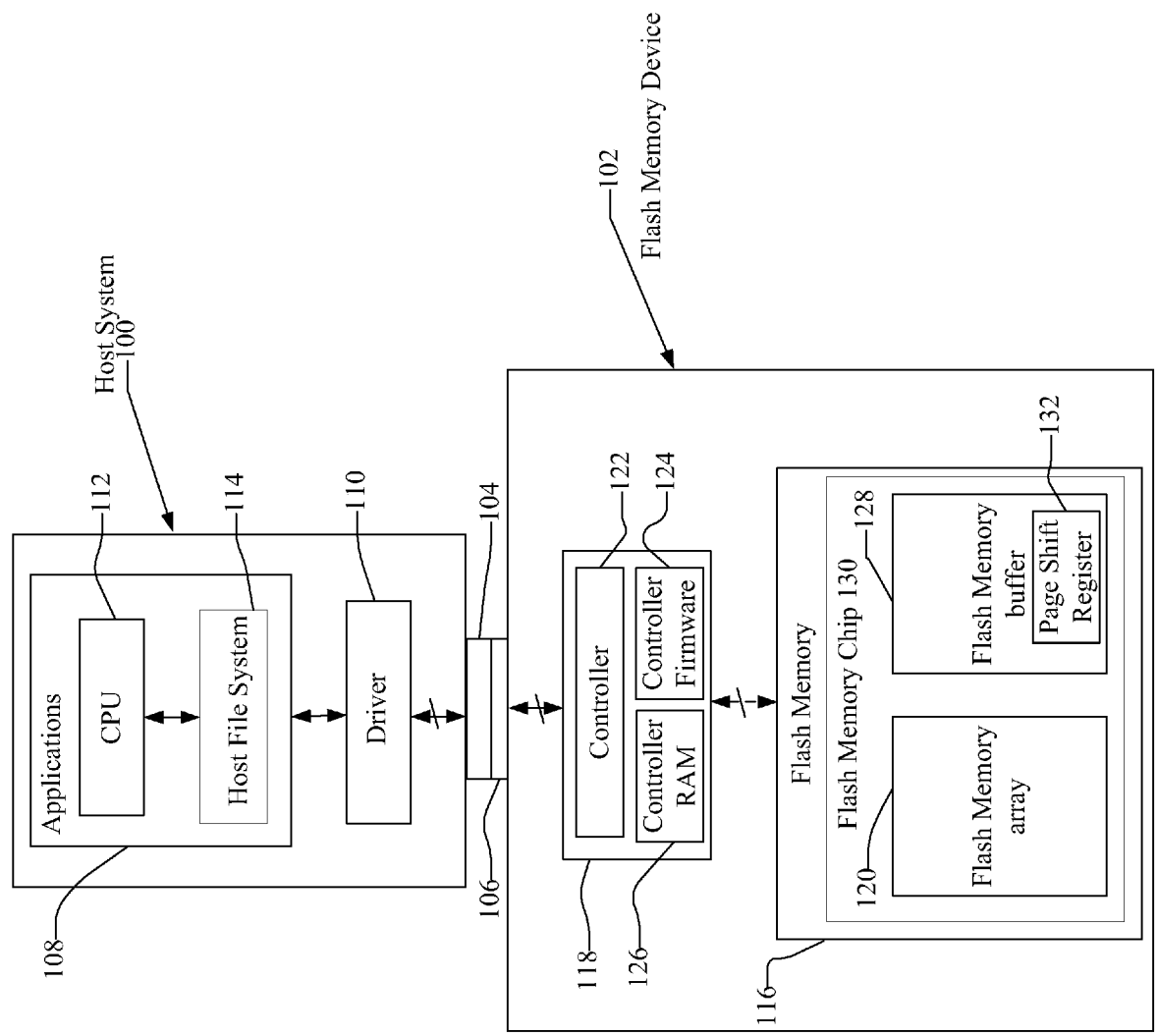
FIG. 1 is a block diagram of a host connected with a memory system having non-volatile memory.

A flash memory system suitable for use in implementing aspects of the invention is shown in FIGS. 1-5. A host system 100 of FIG. 1 stores data into and retrieves data from the flash memory device 102. The data may comprise any information that is received by the flash memory device, including content (such as a video, song, or the like). The flash memory device 102 may be flash memory embedded within the host system, such as in the form of a solid state disk (SSD) drive installed in a personal computer, a computer server, or a storage array. Alternatively, the flash memory device 102 may be in the form of a card that is removably connected to the host system through mating parts 104 and 106 of a mechanical and electrical connector, such as illustrated in FIG. 1. A flash memory device configured for use as an internal or embedded SSD drive may look similar to the schematic of FIG. 1, with the primary difference being the location of the flash memory device 102 internal to the host system 100. SSD drives may be in the form of discrete modules that are drop-in replacements for rotating magnetic disk drives.

One example of a commercially available SSD drive is a 32 gigabyte SSD produced by SanDisk Corporation. Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards has a unique mechanical and/or electrical interface according to its standardized specifications, the flash memory device included in each is similar. Further, the flash memory device may be hand held memory systems in small packages that have a Universal Serial Bus (USB) plug for connecting with a host by plugging into the host system's USB receptacle. Each of these memory cards and flash drives includes controllers that interface with the host and control operation of the flash memory within them.

The host system 100 of FIG. 1 may be viewed as having two major parts, insofar as the flash memory device 102 is concerned, made up of a combination of circuitry and software. They are an applications portion 108 and a driver portion 110 that interfaces with the flash memory device 102. In a PC, for example, the applications portion 108 can include a processor, such as CPU 112 and a memory 114. The memory 114 stores one or more programs for execution by the CPU 112, the execution of which runs various functionalities of a computing device. For example, the memory may include software (such as computer readable instructions) that when executed by the CPU 112 includes the following functionalities: word processing; graphics; control or other popular application software; as well as a file system for managing data on the host system 100. The memory may comprise volatile and/or non-volatile memory, and may store information other than software.

The flash memory device 102 of FIG. 1 may include non-volatile memory, such as flash memory 116, and a system controller 118. The system controller 118 controls the flash memory 116 and communicates with the host system 100 to which the flash memory device 102 is connected in order to pass data back and forth. The system controller 118 may convert between logical addresses of data used by the host system 100 and physical addresses of the flash memory 116 during data programming and reading.

The flash memory 116 may include one or more flash memory chips 130. The flash memory chip 130 includes a flash memory array 120, which is a non-volatile memory, and a flash memory buffer 128, which is a volatile memory. The flash memory buffer 128 may include a page shift register 132, which may perform page swaps, as discussed in more detail below. One example of the page shift register 132 may include using an XDL data latch, such as disclosed in U.S. Patent Application No. 2010/0309720, hereby incorporated by reference herein in its entirety. Further, details on register structures that can be used for the page shift register are described in U.S. Pat. No. 7,170,802, hereby incorporated by reference herein in its entirety.

FIG. 1 illustrates a single flash memory chip 130 with a single flash memory array 120 and a single flash memory buffer 128 by way of example. Further, the flash memory 116 may include multiple die, each containing an array of memory cells organized into multiple planes, and a volatile memory buffer. Alternatively, the memory cell array may not be divided into planes. In an alternate embodiment, the flash memory chips 130 include the flash memory array 120, and a separate chip may include the flash memory buffer 128.

Functionally, the system controller 118 may include a controller 122, which may comprises a processor, control logic, programmable logic array, or the like. The system controller 118 may also include volatile and non-volatile memory, such as controller firmware 124 and controller RAM 126 (or other volatile memory associated with the controller 122). Controller firmware 124 includes instructions which may be executed by controller 122 for coordinating operation of the flash memory 116. The system controller 118 may be implemented on a single integrated circuit chip, such as an application specific integrated circuit (ASIC), or may be also be incorporated into flash memory 116.

The memory cells may be operated to store more than two detectable levels of charge in each charge storage element or region, thereby to store more than one bit of data in each. This configuration is referred to as multi-level cell (MLC) memory. Alternatively, the memory cells may be operated to store two levels of charge so that a single bit of data is stored in each cell. This is typically referred to as a binary or single level cell (SLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

FIG. 2 conceptually illustrates an organization of the flash memory cell array 120 (FIG. 1) that is used as an example in further descriptions below. The flash memory cell array 120 may include multiple memory cell arrays which are each separately controlled by a single or multiple memory controllers 122. Four planes or sub-arrays 202, 204, 206, and 208 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 2 by rectangles, such as blocks 210, 212, 214, and 216, located in respective planes 202, 204, 206, and 208. There can be dozens or hundreds of blocks in each plane.

As mentioned above, the block of memory cells is the unit of erase, the smallest number of memory cells that are physically erasable together. For increased parallelism, however, the blocks are operated in larger metablock units. One block from each plane is logically linked together to form a metablock. The four blocks 210, 212, 214, and 216 are shown to form one metablock 218. All of the cells within a metablock are typically erased together. The blocks used to form a metablock need not be restricted to the same relative locations within their respective planes, as is shown in a second meta block 220 made up of blocks 222, 224, 226, and 228. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

The individual blocks are in turn divided for operational purposes into pages of memory cells, as illustrated in FIG. 3. The memory cells of each of the blocks 210, 212, 214, and 216, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 302 is illustrated in FIG. 3, being formed of one physical page from each of the four blocks 210, 212, 214, and 216. The metapage 302, for example, includes the page P2 in each of the four blocks but the pages of a metapage need not necessarily have the same relative position within each of the blocks. A metapage is the maximum unit of programming.

Figure 4:
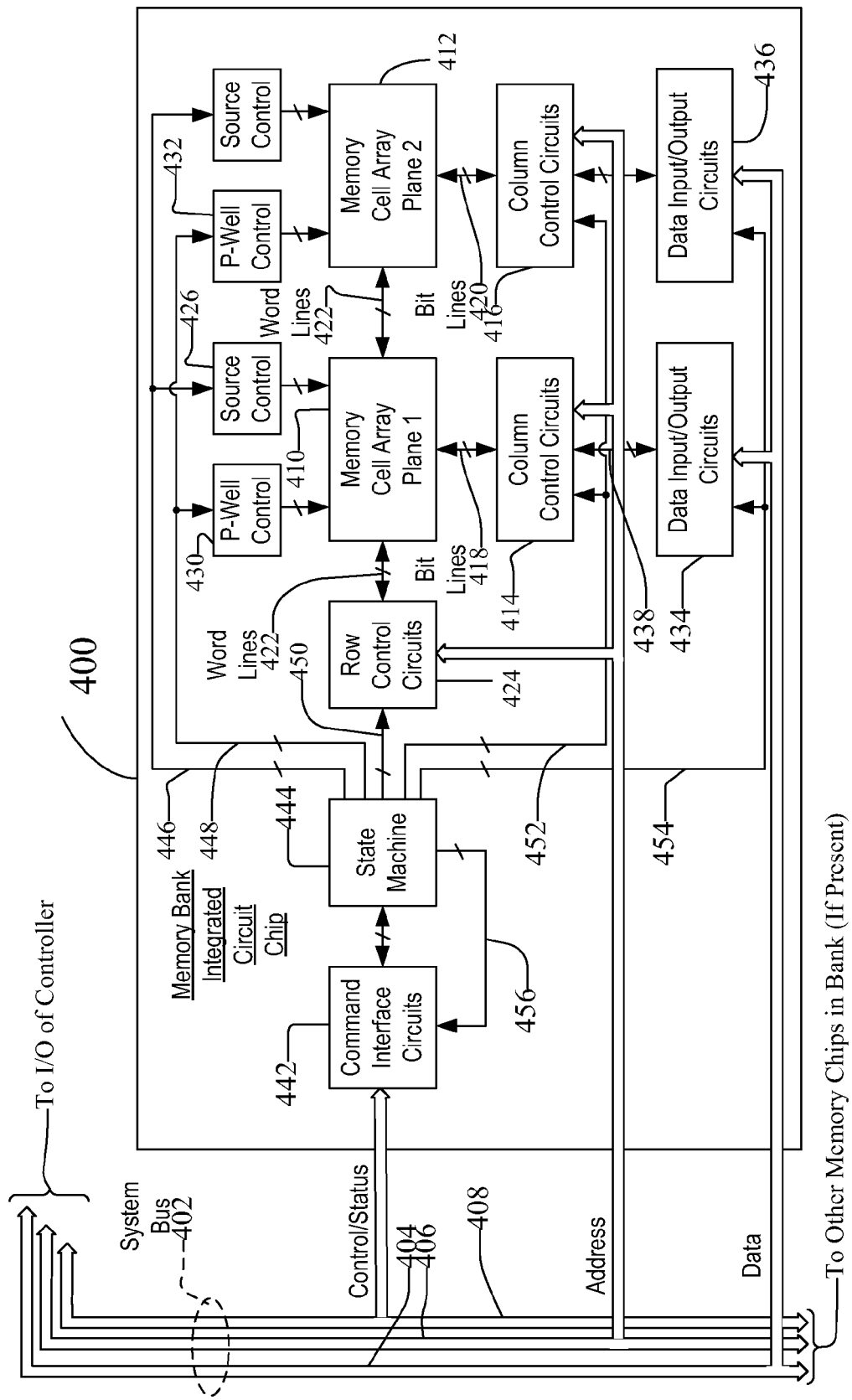
FIG. 4 is an example one flash memory bank suitable as one of the flash memory banks.

Each bank in the multi-bank flash memory may comprise one or more integrated circuit chips, where each chip may contain an array of memory cells organized into multiple planes. An illustration of a memory bank 400 on a single chip is shown in FIG. 4. The memory bank 400 of FIG. 4 shows such planes 410 and 412 for simplicity but a greater number of planes, such as four or eight planes, may instead be used. Alternatively, the memory cell array of a memory bank may not be divided into planes. When so divided, however, each plane has its own column control circuits 414 and 416 that are operable independently of each other. The circuits 414 and 416 receive addresses of their respective memory cell array from the address portion 406 of the system bus 402, and decode them to address a specific one or more of respective bit lines 418 and 420. The wordlines 422 are addressed through row control circuits 424 in response to addresses received on the address bus. Source voltage control circuits 426 and 428 are also connected with the respective planes, as are p-well voltage control circuits 430 and 432. If the bank 400 is in the form of a memory chip with a single array of memory cells, and if two or more such chips exist in the system, the array of each chip may be operated similarly to a plane within the multi-plane chip described above.

Data are transferred into and out of the planes 410 and 412 through respective data input/output circuits 434 and 436 that are connected with the data portion 404 of the system bus 402. The circuits 434 and 436 provide for both programming data into the memory cells and for reading data from the memory cells of their respective planes, through lines 438 and 440 connected to the planes through respective column control circuits 414 and 416.

Each memory chip in each bank contains some controlling circuitry that executes commands from the controller 122 to perform such functions. Interface circuits 442 are connected to the control and status portion 408 of the system bus 402. Commands from the controller 122 are provided to a state machine 444 that then provides specific control of other circuits in order to execute these commands. Control lines 446-454 connect the state machine 444 with these other circuits as shown in FIG. 4. Status information from the state machine 444 is communicated over lines 456 to the interface 442 for transmission to the controller 122 over the bus portion 408.

A NAND architecture of the memory cell arrays 410 and 412 is discussed below, although other non-volatile memory architectures or technologies, alone or combination, such as NOR, can be used instead. An example NAND array is illustrated by the circuit diagram of FIG. 5, which is a portion of the memory cell array 410 of the memory bank 400 of FIG. 4. A large number of global bit lines are provided, only four such lines 502-508 being shown in FIG. 5 for simplicity of explanation. A number of series connected memory cell strings 510-524 are connected between one of these bit lines and a reference potential. Using the memory cell string 514 as representative, a plurality of charge storage memory cells 526-532 are connected in series with select transistors 534 and 536 at either end of the string. When the select transistors of a string are rendered conductive, the string is connected between its bit line and the reference potential. One memory cell within that string is then programmed or read at a time.

Figure 5:
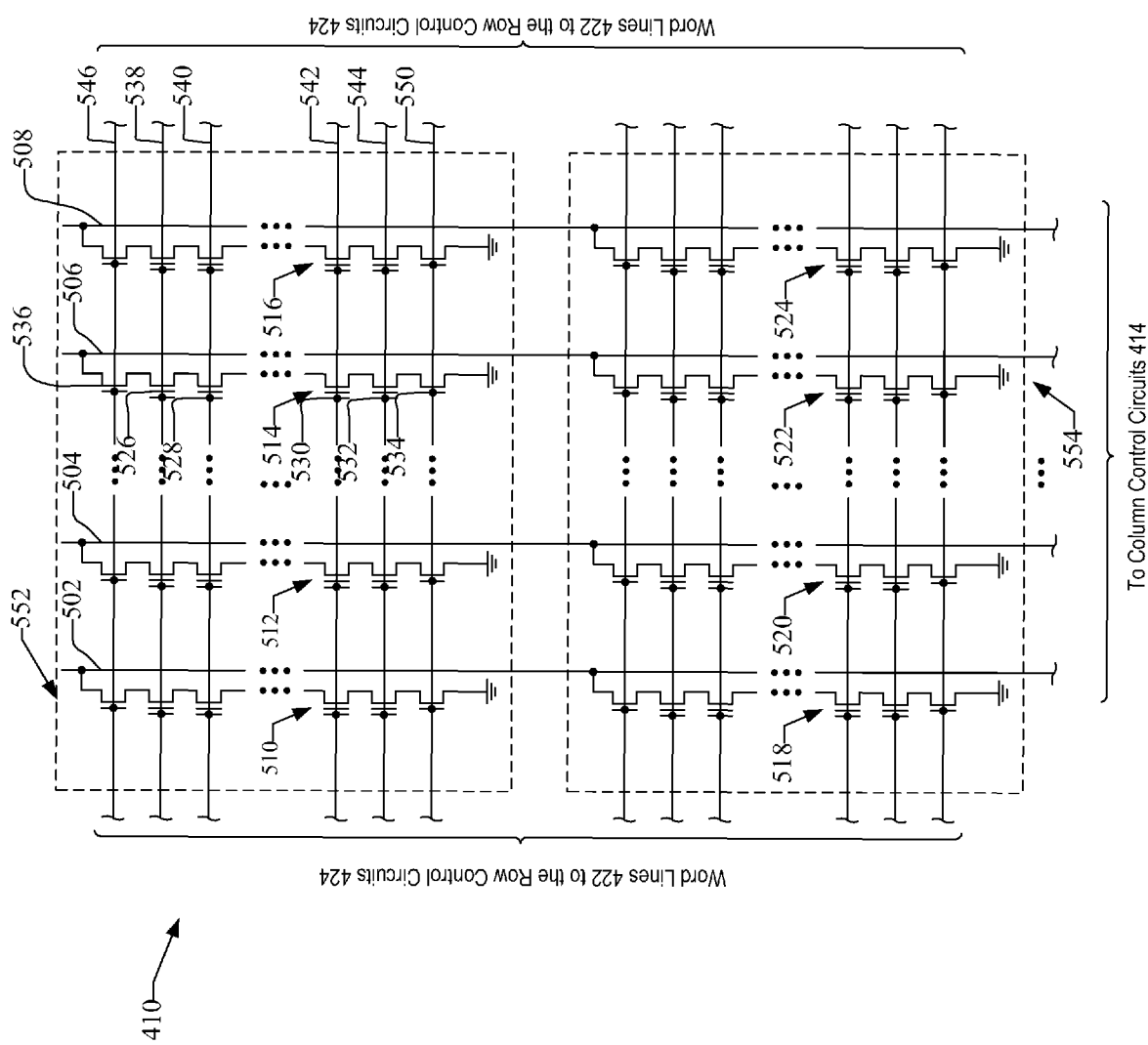
FIG. 5 is a representative circuit diagram of a memory cell array that may be used in the memory bank of FIG. 4.

Wordlines 538-544 of FIG. 5 individually extend across the charge storage element of one memory cell in each of a number of strings of memory cells, and gates 546 and 550 control the states of the select transistors at each end of the strings. The memory cell strings that share common word and control gate lines 538-550 are made to form a block 552 of memory cells that are erased together. This block of cells contains the minimum number of cells that are physically erasable at one time. One row of memory cells, those along one of the wordlines 538-544, are programmed at a time. Typically, the rows of a NAND array are programmed in a prescribed order, in this case beginning with the row along the wordline 544 closest to the end of the strings connected to ground or another common potential. The row of memory cells along the wordline 542 is programmed next, and so on, throughout the block 552. The row along the wordline 538 is programmed last.

A second block 554 is similar, its strings of memory cells being connected to the same global bit lines as the strings in the first block 552 but having a different set of word and control gate lines. The word and control gate lines are driven to their proper operating voltages by the row control circuits 524. If there is more than one plane in the system, such as planes 1 and 2 of FIG. 4, one memory architecture uses common wordlines extending between them. There can alternatively be more than two planes that share common wordlines. In other memory architectures, the wordlines of individual planes are separately driven.

The system controller 118 may control the circuitry discussed with regard to FIGS. 4-5 in order to read and write planes in parallel. An example of the reading and writing of the planes in parallel is discussed with respect to FIG. 6.

As discussed above, it is beneficial to minimize the flash memory device's metablock size in order to reduce the system write amplification factor. However, a small metablock size reduces the number of planes that can be operated in parallel, thereby increasing the time in which to program the flash memory device.

Metablock sizes are typically kept smaller in order to comply with various standards, as discussed above. For example, a NAND Flash memory device with a 2 MB block size and four planes would have a metablock size of 8 MB if all of the planes are operated in parallel. Operating the 4 planes of such a flash memory device in parallel is optimal when a fast download of content is desired. However, using such a large metablock size in normal operation may not be recommended. As merely one reason, a flash memory device with such a large metablock size may have difficulty meeting the SD speed class benchmark due to the fact that the metablock size is 8 MB and the Secure Digital High Capacity (SDHC) standard atomic unit size is only 4 MB. Thus, in previous flash memory devices, block sizes were kept small (i.e., <=1 MB) so that up to 4 planes could be operated in parallel while still meeting the SDHC standard atomic unit size of 4 MB. However, this emphasis on smaller block sizes conflicts with trends in flash memory devices, which over time, result in NAND block sizes continuing to increase. This is due to compensate for longer programming times and due to cost reductions achieved with longer NAND strings.

Moreover, for many flash memory devices, it can be shown that the system write amplification (W/A) factor is proportional to the flash memory device's metablock size. Because the flash memory device is erased before it can be rewritten, the process to perform these operations results in moving (or rewriting) user data and metadata more than once. This multiplying effect results in the write amplification in that it increases the number of writes required over the life of the flash memory device, which shortens the time the flash memory device can reliably operate. Therefore, in general, it is beneficial to minimize the flash memory device's metablock size to be as small as possible while still meeting product performance requirements. However, a small metablock size reduces the number of planes that can be operated in parallel, thereby increasing the time in which to program the flash memory device.

Figure 6:
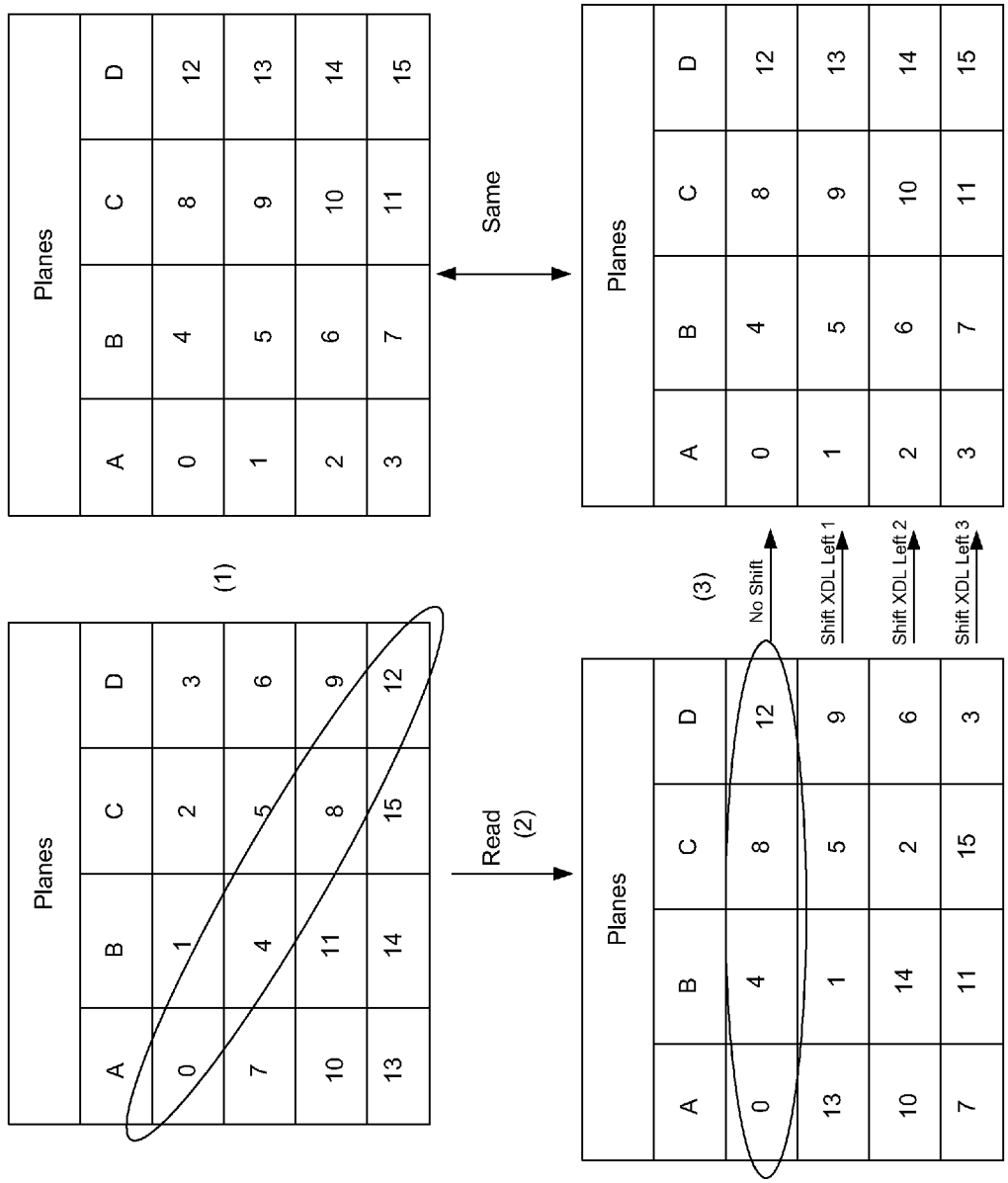
FIG. 6 illustrates a series of representations of pages of data stored in different planes.
Figure 7:
FIG. 7 illustrates another series of representations of pages of data stored in different planes.
Figure 8:
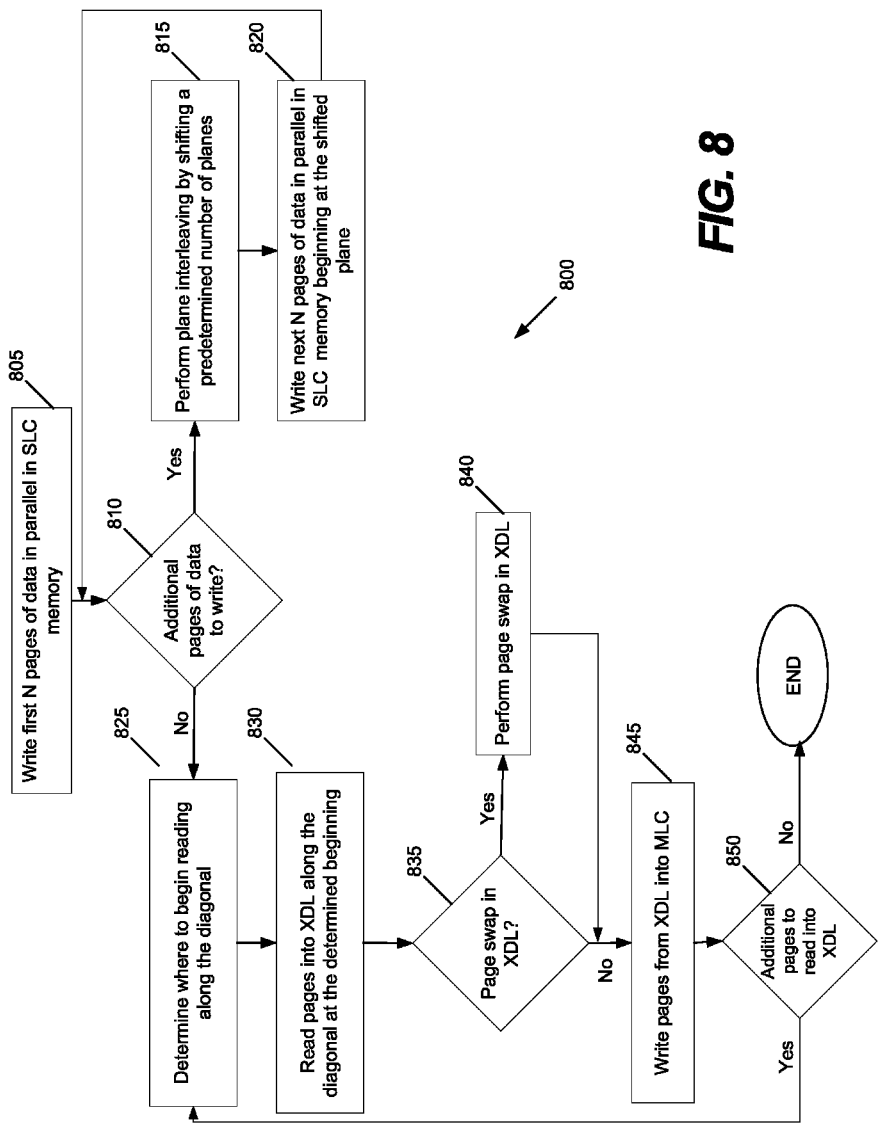
FIG. 8 is a flow chart for storing data using plane interleaving and page swapping.

Using the methodology described in FIGS. 6-8 enables a smaller metablock size while reducing the write amplification factor. FIG. 6 illustrates one or more parts of the flash memory chip 130. As shown in FIG. 6, there are 16 pages of data being written to 4 planes (planes A, B, C, and D). The data is streamed sequentially to the memory device. In the example illustrated in FIG. 6, the pages of data are streamed as follows: 0, 1, 2, 3, 4, 5, 6, 7, 8, 9, 10, 11, 12, 13, 14, and 15.

The names of the planes shown in FIG. 6 are merely for illustration purposes. Moreover, the tables shown in FIG. 6 are merely for illustration purposes. The data need not be stored in sequential physical planes in the memory device. Instead, the data may be stored in sequential logical planes in the memory device. Moreover, the sequential pages of data need not be stored in physically sequential or contiguous pages in memory. Rather, the pages of data may be stored in logically sequential pages in memory.

In addition, the number of planes and number of pages shown in FIG. 6 are merely for illustration purposes. There may be more or fewer planes than illustrated in FIG. 6. Further, there may be more or fewer pages than illustrated in FIG. 6. Further, the number of pages may be equal to the number of planes, such the 4×4 table as shown in FIG. 6, a 5×5 table, a 6×6 table, or the like. Alternatively, the number of pages may be different than the number of planes (so that the number of planes may be less than or greater than the number of pages), such as illustrated in FIG. 7. In particular, the methodology described in FIGS. 6-8 includes a row-to-column conversion (in which the pages are considered the rows and the planes are considered the columns). In this way, the number of rows by the number of columns at the beginning of the process (illustrated in the upper left of FIG. 6) will be the same as the number of columns by the number of rows (illustrated in the lower right of FIG. 6).

It may be desirable to store the data sequentially (logically and/or physically sequentially) in the memory device, such as illustrated in the table in the lower right corner of FIG. 6. For example, plane A has stored therein a sequential series of pages, with the first page in plane A storing the first page of data (designated as page 0), the second page in plane A storing the second page of data (designated as page 1), the third page in plane A storing the third page of data (designated as page 2), and the fourth page in plane A storing the fourth page of data (designated as page 3). So that, plane A includes the first four pages of data as streamed to the memory device. Similarly, plane B includes the second four pages of data as streamed to the memory device (with the first page in plane B storing the fifth page of data (designated as page 4), the second page in plane B storing the sixth page of data (designated as page 5), the third page in plane B storing the seventh page of data (designated as page 6), and the fourth page in plane B storing the eighth page of data (designated as page 7).

There are different ways in which to program the memory device in order to achieve the sequential listing as illustrated in the table in the lower right corner of FIG. 6. In particular, FIG. 6 illustrates two different ways in which to achieve the sequential listing: (1) with no interleaving of planes; and (2) with plane interleaving. Typically, data is first stored in one memory (such as SLC memory, MLC memory, DRAM, SRAM) and ultimately stored in another memory (such as MLC memory).

Programming the memory with no plane interleaving is illustrated in the table in the upper right corner of FIG. 6. As shown, the sequence of the data as stored in the upper right corner is as desired, with each plane include sequential pages of data. For example, plane A includes the first four pages of data (pages 0, 1, 2, and 3). However, the time in which to program the planes in this order is high. A single page in a specific plane is programmed at a time. So that, in order to achieve the sequence of pages shown in the table in the upper right corner of FIG. 6, the pages are programmed sequentially such that page 0 is first programmed in the first page of plane A, then page 1 is programmed in the second page of plane A, then page 2 is programmed in the third page of plane A, and then page 3 is programmed in the fourth page of plane A. In this way, parallel programming is not used. The table in the upper right corner of FIG. 6 is exactly the same as the table in the lower right corner of FIG. 6 (the desired sequence). So that, the table in the upper right corner of FIG. 6 (which may be stored in SLC memory) may be directly copied using parallel programming to the destination (which may comprise MLC memory).

Programming with plane interleaving is illustrated in the table in the upper left corner of FIG. 6. With plane interleaving, the memory device is able to co-locate data (such as pages 0, 1, 2, 3) in one block or one plane, so that the co-located data can be locally updated without requiring to involve other data (e.g., co-locating pages 0, 1, 2, 3 can be updated without involving pages 4, 5, etc.). Further, the co-location of data in one block does not reduce program and read parallelism. As shown in FIG. 6, for example, reading and writing of pages may both be performed in parallel. Moreover, 'vertical' and 'horizontal' storage may be used in the same storage device. 'Vertical' storage can be preferred for MLC (such as cells that store 2 bits (X2) or 3 bits (X3)) since it reduces write amplification (or the amount of data necessary to copy during a data update), thereby reducing impact on the endurance of the storage device. 'Horizontal' storage can be preferred for SLC as it has high parallelism in all cases.

The first step is iteratively writing portions of the data in parallel into a page in each of the plurality of planes. Similar to the table in upper right corner of FIG. 6, the table in the upper left corner of FIG. 6 may be stored in SLC memory. In the example illustrated in FIG. 6, a page is programmed in each of planes A, B, C, and D. In particular, the portions of data first programmed in parallel are pages 0, 1, 2, and 3. In the next iteration of writing, the portions of data programmed in parallel are pages 4, 5, 6, and 7. However, the data in the next iteration is written using plane interleaving. As shown in FIG. 6, instead of writing the next page of data (page 4) to plane A, the pages are shifted the equivalent of 1 plane so that the data for page 4 is written to plane B, the data for page 5 is written to plane C, and so on. In this way, the parallel programming sequence between the first parallel programming (programming pages 0, 1, 2, and 3) is different from the second parallel programming (programming pages 4, 5, 6, and 7). Likewise, in the next iteration of writing, the portions of data programmed in parallel are pages 8, 9, 10, and 11 with plane interleaving that results in an equivalent shift of 2 planes. Thus, in each of the successive iterations of parallel programming, the planes are interleaved in a predetermined way (e.g., each successive iteration shifts a predetermined amount of the equivalent of shifting 1 plane).

After iteratively writing the incoming data, the data may likewise be iteratively read. The iterative reading of the data may be performed in parallel or not. For example, if all of the planes are on the same die, the read may be performed in parallel. Alternatively, the read for each of the pages may be performed separately.

As shown in FIG. 6, a page from each of planes A, B, C, and D may be iteratively read into XDL registers. However, the page read from each of planes A, B, C, and D is in a different one of the sequence of pages. For example, in the first iteration of reading as shown in the table in the upper left corner of FIG. 6, page 0 is read from plane A, page 4 is read from plane B, page 8 is read from plane C, and page 12 is read from plane D. In this way, the plane read from each of the planes along the diagonal (as shown in FIG. 6), and is in a different sequence of the pages in the plane, with the page read from plane A being the first page in the sequence of pages in plane A, the page read from plane B being the second page in the sequence of pages in plane B, the page read from plane C being the third page in the sequence of pages in plane C, and the page read from plane D being the fourth page in the sequence of pages in plane D.

After reading the data, it is determined whether to shift the data. As shown in FIG. 6, the data read from pages 0, 4, 8, and 12 is not shifted, so that the data is then stored using parallel programming to the destination (which may comprise MLC memory).

In the second iteration of reading, page 13 is read from plane A, page 1 is read from plane B, page 5 is read from plane C, and page 9 is read from plane D. Similar to the first iteration of reading, the plane read from each of the planes is in a different sequence of the pages in the plane. However, the sequence in the second iteration of reading is different from the first sequence. The page read from the first plane (plane A) being the last page in the sequence of pages in plane A, the page read from plane B being the first page in the sequence of pages in plane B, the page read from plane C being the second page in the sequence of pages in plane C, and the page read from plane D being the third page in the sequence of pages in plane D.

After reading the data, it is determined whether to shift the data. As shown in FIG. 6, the data read from pages 13, 1, 5, and 9 is shifted the equivalent of 1 plane (such as 1 shift to the left), so that the planes A, B, C, and D include data from pages 1, 5, 9, and 13, respectively. The shifting may be performed internally on the flash memory chip 130, using an on chip XDL rotation that rearranges or swaps the pages written into a desired order. In this way, the shifting need not include a transfer of data off-chip, which could cause delay. After which, the data is stored using parallel programming to the destination.

In the third iteration of reading, page 10 is read from plane A, page 14 is read from plane B, page 2 is read from plane C, and page 6 is read from plane D. Similar to the first and second iterations of reading, the plane read from each of the planes is in a different sequence of the pages in the plane. However, the sequence in the third iteration of reading is different. The page read from the first plane (plane A) being the second to last page in the sequence of pages in plane A, the page read from plane B being the last page in the sequence of pages in plane B, the page read from plane C being the first page in the sequence of pages in plane C, and the page read from plane D being the second page in the sequence of pages in plane D.

As shown in FIG. 6, the data read from pages 10, 14, 2, and 6 is shifted the equivalent of 2 planes (such as 2 shifts to the left or 2 shifts to the right), so that the planes A, B, C, and D include data from pages 2, 6, 10, and 14, respectively. After which, the data is stored using parallel programming to the destination.

In the fourth iteration of reading, page 7 is read from plane A, page 11 is read from plane B, page 15 is read from plane C, and page 3 is read from plane D. Similar to the first, second, and third iterations of reading, the plane read from each of the planes is in a different sequence of the pages in the plane. However, the sequence in the fourth iteration of reading is different. The page read from the first plane (plane A) being the third to last page in the sequence of pages in plane A, the page read from plane B being the second to last page in the sequence of pages in plane B, the page read from plane C being the last page in the sequence of pages in plane C, and the page read from plane D being the first page in the sequence of pages in plane D.

As shown in FIG. 6, the data read from pages 7, 11, 15, and 3 is shifted the equivalent of 3 planes (such as 3 shifts to the left or 1 shift to the right), so that the planes A, B, C, and D include data from pages 3, 7, 11, and 15, respectively. After which, the data is stored using parallel programming to the destination.

As shown in FIG. 6, using plane interleaving, reading along the diagonals, and page swapping in XDL enables parallel writing and reading of the data in order to achieve the sequence of pages as shown in the table of the lower right corner of FIG. 6

As discussed above, the number of pages may be different than the number of planes (so that the number of planes may be less than or greater than the number of pages). An example of this is illustrated in FIG. 7, which uses 3 planes (planes A, B, and C) with four pages in each plane (3×4) for SLC memory, and uses 4 planes (planes A, B, C, and D) with three pages in each plane (4×3) for MLC memory. Note that in the upper left table in FIG. 7, there are two reads of a plane. For example, when reading pages 0, 3, 6, and 9, there are two reads of Plane A (for pages 0 and 9).

FIG. 8 illustrates a flow chart 800 for writing data into a flash memory device. At 805, the first N pages of data are written in parallel (such as into SLC memory). At 810, the system controller 118 determines if there are additional pages of data to write. If so, at 815, plane interleaving is performed. One example of plane interleaving is to shift a predetermined number of planes. At 820, the next N pages of data are written in parallel to SLC memory beginning at the shifted plane. For example, as shown in FIG. 6, in the write of pages 4, 5, 6, and 7, a shift is made to plane B. Then, pages 4, 5, 6, and 7 are written to planes B, C, D, and A, respectively.

If there are no additional pages of data to write, at 825, the system controller 118 determines where to begin reading along the diagonal. At 830, the pages are read into XDL along the diagonal at the determined beginning. As discussed with respect to FIG. 6, pages in the different planes are read. More specifically, different pages (in the sequence of pages) may be read from the planes, with the reading either in parallel or not. An example of this is the pages read that are along a diagonal, as illustrated in FIG. 6. In the first reading, the reading along the diagonal begins at plane A, page 1, and proceeds to plane B, page 2, plane C, page 3, and plane D, page 4. In the next reading, the reading along the diagonal begins at plane A, page 4, and proceeds to plane B, page 1, plane C, page 2, and plane D, page 3. In this way, the point at which to begin reading along the diagonal moves a predetermined amount (the equivalent of subtracting 1 page in the sequence of pages in plane A).

At 835, the system controller 118 determines whether to page swap in XDL. If so, at 840, a page swap is performed. This is illustrated in FIG. 6, which includes examples of shifts of pages. After which, at 845, the pages are written from XDL into multi-level cell memory. At 850, the system controller 118 then determines if there are additional pages to be read into XDL. If so, the flow chart loops back to 825.

Accordingly, the method and system may be realized in hardware, software, or a combination of hardware and software. The method and system may be realized in a centralized fashion in at least one electronic device (such as illustrated in flash memory device 102 in FIG. 1) or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

What is claimed is:

1. A method for storing data in a flash storage device, the method comprising:
   in a flash storage device having a controller and a memory in communication with the controller, the memory including a plurality of planes, each of the planes having a sequence of pages:
   receiving data;
   iteratively writing portions of the data in parallel into a page in each of the plurality of planes;
   reading the pages in each of the planes, at least some of the pages read in parallel being in a different respective page of the sequence of pages in the respective plane;
   determining, for at least one of the pages read, whether to shift pages from an initial plane to a different one of the planes; and
   storing the data in the memory based on the determined shift,
   wherein the determined shift and the storage of the data result in a sequential ordering of data within the numbered sequence of pages in at least one of the planes.

2. The method of claim 1, wherein the plurality of planes comprise "N" number of planes;
   wherein the portions of the data comprise "N" pages of the data;
   wherein iteratively writing the "N" pages of data in parallel comprises:
   writing the first "N" pages of data in parallel in a first sequence across the "N" number of planes; and
   writing subsequent pages of data in parallel in a sequence across the "N" number of planes that is different from the first sequence.

3. The method of claim 2, wherein iteratively writing the "N" pages of data in parallel further comprises, for each iteration, shifting a predetermined number of planes to begin the "N" pages of data.

4. The method of claim 1, wherein reading the pages in each of the planes comprises:
   reading a page from each of the plurality of planes in parallel, the page read from each of the plurality of planes in a different one of the sequence of pages.

5. The method of claim 4, wherein the memory includes single level cell memory with N planes;
   wherein iteratively writing portions of the data in parallel into a page in each of the plurality of planes comprises writing the data in the N pages of each of the N planes;
   wherein reading in parallel the N pages in each of the N planes comprises:
   reading N pages in parallel from each of the N planes N times such that:
   in a first parallel reading, reading the first page of the first of the N planes, reading the second page of the second of the N planes, reading the third page of the third of the N planes, and continuing the sequence of reading until the Nth page is read from the Nth of the N planes;
   in a second parallel reading, reading from the Nth page of the first of the N planes, reading the first page of the second of the N planes, reading the second page of the third of the N planes, and continuing the sequence of reading until the Nth−1 page is read from the Nth of the N planes;

in a third parallel reading, reading from the Nth−1 page of the first of the N planes, reading the Nth page of the second of the N planes, reading the first page of the third of the N planes, and continuing the sequence of reading until the Nth−2 page is read from the Nth of the N planes; and continuing the sequence of parallel readings until the Nth parallel reading, which includes reading the second page of the first of the N planes, reading the third page of the second of the N planes, reading the fourth page of the third of the N planes, and continuing the sequence of reading until the first page is read from the Nth of the N planes.

6. The method of claim 5, wherein determining whether to shift pages from an initial plane to a different one of the planes comprises:

performing no reordering of the first page in each of the N planes;

performing a reordering using at least one page shift register such that the second page in each of the N planes is shifted the equivalent of one position left so that data stored in the second page in the first of the N planes is moved to the second page in the Nth of the N planes, data stored in the second page in the second of the N planes is moved to the second page in the first of the N planes, data stored in the second page in the third of the N planes is moved to the second page in the second of the N planes;

performing a reordering using the at least one page shift register such that the third page in each of the N planes is shifted the equivalent of two positions left; and iteratively performing, until the Nth page, a reordering using the at least one page shift register such that the Xth page in each of the N planes is shifted the equivalent of Xth−1 positions left.

7. The method of claim 1, wherein the determined shift and the storage of the data result in a sequential ordering of data within the numbered sequence of pages in all of the planes.

8. The method of claim 7, wherein the memory includes single level cell memory with N planes and M pages in each of the planes;

wherein the memory includes multi-level cell memory with N planes and M pages in each of the planes;

wherein iteratively writing portions of the data in parallel into a page in each of the plurality of planes comprises iteratively writing the portions of the data in parallel to a page in single level cell memory in each of the N planes; and wherein storing the data in the memory based on the determined shift comprises storing the data in parallel in the multi-level cell memory so that the first plane includes pages 0 through M−1, the second plane includes pages M through 2M−1, the third plane includes pages 2M through 3M−1, and continuing the sequence of the planes with the Nth page including pages (N−1)×M page through N×M−1 page.

9. The method of claim 8, wherein N=M.

10. The method of claim 8, further comprising shifting at least some of the pages in response to determining whether to shift the pages; and wherein storing the data in the memory based on the determined shift comprises storing the shifted pages into multi-level cell memory.

11. The method of claim 1, wherein iteratively writing portions of the data in parallel into a page in each of the plurality of planes comprises iteratively writing the portions of the data into single level cell memory;

further comprising shifting at least some of the pages in response to determining whether to shift the pages; and wherein storing the data in the memory based on the determined shift comprises storing the shifted pages into multi-level cell memory.

12. A flash memory device configured to store data, the flash memory device comprising:

a memory including a plurality of planes, each of the planes having a sequence of pages; and a controller in communication with the memory, the controller is configured to:

receive data;

iteratively write portions of the data in parallel into a page in each of the plurality of planes;

read the pages in each of the planes, at least some of the pages read in parallel being in a different respective page of the sequence of pages in the respective plane;

determine, for at least one of the pages read in parallel, whether to shift pages from an initial plane to a different one of the planes; and store the data in the memory based on the determined shift, wherein the determined shift and the storage of the data result in a sequential ordering of data within the numbered sequence of pages in at least one of the planes.

13. The flash memory device of claim 12, wherein the plurality of planes comprise "N" number of planes;

wherein the portions of the data comprise "N" pages of the data;

wherein the controller is configured to iteratively write the "N" pages of data in parallel by:

writing the first "N" pages of data in parallel in a first sequence across the "N" number of planes; and writing subsequent pages of data in parallel in a sequence across the "N" number of planes that is different from the first sequence.

14. The flash memory device of claim 13, wherein the controller is configured to iteratively write the "N" pages of data in parallel by, for each iteration, shifting a predetermined number of planes to begin the "N" pages of data.

15. The flash memory device of claim 12, wherein the controller is configured to read in parallel the pages in each of the planes by:

reading a page from each of the plurality of planes in parallel, the page read from each of the plurality of planes in a different one of the sequence of pages.

16. The flash memory device of claim 15, wherein the memory includes single level cell memory with N planes;

wherein the controller is configured to iteratively write portions of the data in parallel into a page in each of the plurality of planes by writing the data in the N pages of each of the N planes;

wherein the controller is configured to read in parallel the N pages in each of the N planes by:

reading N pages in parallel from each of the N planes N times such that:

in a first parallel reading, reading the first page of the first of the N planes, reading the second page of the second of the N planes, reading the third page of the third of the N planes, and continuing the sequence of reading until the Nth page is read from the Nth of the N planes;

in a second parallel reading, reading from the Nth page of the first of the N planes, reading the first page of the second of the N planes, reading the second page of the third of the N planes, and continuing the sequence of reading until the Nth−1 page is read from the Nth of the N planes;

in a third parallel reading, reading from the Nth−1 page of the first of the N planes, reading the Nth page of the second of the N planes, reading the first page of the third of the N planes, and continuing the sequence of reading until the Nth−2 page is read from the Nth of the N planes; and continuing the sequence of parallel readings until the Nth parallel reading, which includes reading the second page of the first of the N planes, reading the third page of the second of the N planes, reading the fourth page of the third of the N planes, and continuing the sequence of reading until the first page is read from the Nth of the N planes.

17. The flash memory device of claim 16, further comprising at least one page shift register; and
wherein the controller is configured to determine whether to shift pages from an initial plane to a different one of the planes by:
performing no reordering of the first page in each of the N planes;
performing a reordering using the at least one page shift register such that the second page in each of the N planes is shifted the equivalent of one position left so that data stored in the second page in the first of the N planes is moved to the second page in the Nth of the N planes, data stored in the second page in the second of the N planes is moved to the second page in the first of the N planes, data stored in the second page in the third of the N planes is moved to the second page in the second of the N planes;
performing a reordering using the at least one page shift register such that the third page in each of the N planes is shifted the equivalent of two positions left; and
iteratively performing, until the Nth page, a reordering using the at least one page shift register such that the Xth page in each of the N planes is shifted the equivalent of Xth−1 positions left.

18. The flash memory device of claim 12, wherein the determined shift and the storage of the data result in a sequential ordering of data within the numbered sequence of pages in all of the planes.

19. The flash memory device of claim 18, wherein the memory includes single level cell memory with N planes and M pages in each of the planes;
wherein the memory includes multi-level cell memory with N planes and M pages in each of the planes;
wherein the controller is configured to iteratively write portions of the data in parallel into a page in each of the plurality of planes by iteratively writing the portions of the data in parallel to a page in single level cell memory in each of the N planes; and
wherein the controller is configured to store the data in the memory based on the determined shift by storing the data in parallel in the multi-level cell memory so that the first plane includes pages 0 through M−1, the second plane includes pages M through 2M−1, the third plane includes pages 2M through 3M−1, and continuing the sequence of the planes with the Nth page including pages (N−1)×M page through N×M−1 page.

20. The flash memory device of claim 19, wherein the controller is further configured to shift at least some of the pages in response to determining whether to shift the pages; and
wherein the controller is configured to store the data in the memory based on the determined shift by storing the shifted pages into multi-level cell memory.

21. The flash memory device of claim 12, wherein the controller is configured to iteratively write portions of the data in parallel into a page in each of the plurality of planes by iteratively writing the portions of the data into single level cell memory;
wherein the controller is further configured to shift at least some of the pages in response to determining whether to shift the pages; and
wherein the controller is configured to store the data in the memory based on the determined shift by storing the shifted pages into multi-level cell memory.

* * * * *